US006815355B2

(12) United States Patent
Quek

(10) Patent No.: US 6,815,355 B2
(45) Date of Patent: Nov. 9, 2004

(54) METHOD OF INTEGRATING L-SHAPED SPACERS IN A HIGH PERFORMANCE CMOS PROCESS VIA USE OF AN OXIDE-NITRIDE-DOPED OXIDE SPACER

(75) Inventor: Elgin Quek, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 223 days.

(21) Appl. No.: 10/267,206

(22) Filed: Oct. 9, 2002

(65) Prior Publication Data

US 2004/0072435 A1 Apr. 15, 2004

(51) Int. Cl.⁷ .............................................. H01L 21/302
(52) U.S. Cl. ...................... 438/694; 438/696; 438/705; 438/706; 438/719; 438/723; 438/724
(58) Field of Search ................................. 438/694, 696, 438/705, 706, 719, 723, 724

(56) References Cited

U.S. PATENT DOCUMENTS

| | | | |
|---|---|---|---|
| 6,025,267 A | 2/2000 | Pey et al. .................... | 438/656 |
| 6,156,598 A | 12/2000 | Zhou et al. ................... | 438/231 |
| 6,251,764 B1 | 6/2001 | Pradeep et al. ............. | 438/595 |
| 6,277,683 B1 | 8/2001 | Pradeep et al. ............. | 438/200 |
| 6,313,020 B1 * | 11/2001 | Kim et al. .................... | 438/591 |
| 6,512,273 B1 * | 1/2003 | Krivokapic et al. ........ | 257/369 |
| 6,524,903 B2 * | 2/2003 | Ootsuka et al. ............ | 438/217 |
| 6,555,879 B1 * | 4/2003 | Krivokapic et al. ........ | 257/382 |
| 6,630,721 B1 * | 10/2003 | Ligon ......................... | 257/413 |
| 6,642,119 B1 * | 11/2003 | Pelella et al. ............... | 438/303 |
| 6,730,553 B2 * | 5/2004 | Cho et al. ................... | 438/210 |
| 6,747,328 B2 * | 6/2004 | Wu ............................. | 257/412 |

* cited by examiner

Primary Examiner—Nadine G. Norton
Assistant Examiner—Binh X. Tran
(74) Attorney, Agent, or Firm—George O. Saile; Rosemary L. S. Pike

(57) ABSTRACT

A process for fabricating a complimentary metal oxide semiconductor (CMOS), device featuring composite insulator spacer shapes which allow P channel (PMOS), short channel effects to be minimized, and allow reductions in resistance for N channel (NMOS), source/drain extension regions to be realized, has been developed. The process features initial composite insulator spacers formed in the sides of gate structures after definition of the NMOS and PMOS source/drain extension regions. The initial composite insulator spacer, comprised of an underlying silicon oxide component, an L-shaped silicon nitride component, and an overlying doped oxide component, is then used for definition of the PMOS heavily doped source/drain region, allowing for adequate space between the heavily doped source/drain and channel regions, thus reducing the risk of short channel effects. After removal of the doped oxide component, the L-shaped composite insulator spacer is used to define, via ion implantation procedures, an NMOS heavily doped region, featuring a portion of the heavily doped source/drain region formed underlying a horizontal feature of the L-shaped silicon nitride component, therefore compensating a portion of the NMOS source/drain extension region, and resulting in the desired reduction in source/drain resistance.

28 Claims, 4 Drawing Sheets

METHOD OF INTEGRATING L-SHAPED SPACERS IN A HIGH PERFORMANCE CMOS PROCESS VIA USE OF AN OXIDE-NITRIDE-DOPED OXIDE SPACER

BACKGROUND OF THE INVENTION (1) Field of the Invention

The present invention relates to methods used to fabricate semiconductor devices, and more specifically to a method used to integrate the formation of composite insulator spacers on the sides of gate structures of complimentary metal oxide semiconductor (CMOS), devices.

(2) Description of Prior Art

The ability to fabricate CMOS devices comprised of both N channel (NMOS), and P channel (PMOS), devices, on the sane semiconductor chip, requires shared process steps and sequences in order to minimize process complexity as well as processing costs. A specific process sequence, the formation of insulator spacers on the sides of gate structures, can sometimes be shared resulting in identical insulator, or composite insulator spacers, residing on the sides of both NMOS and PMOS gate structures. However to optimize specific device parameters such as minimized series resistance for NMOS devices, as well as reduced risk of short channel effects for PMOS devices, innovations to a global composite insulator spacer process have to be achieved.

This invention will describe a process sequence for formation of a composite insulator spacer on the sides of CMOS gate structures, in which PMOS short channel effects are minimized via source/drain implantation using a composite insulator spacer as a mask, while series resistance for the NMOS device is minimized via source/drain implantation using a thinned composite insulator spacer as a mask. This invention will also feature reductions in the level of isolation field removed during this unique process sequence used to form CMOS spacers. Prior art, such as Pradeep et al, in U.S. Pat. No. 6,277,683B1, describe a process for forming composite spacers on the sides of CMOS devices, however that prior art does not feature the unique process sequence described in this present invention in which an initial composite insulator spacer is used as an implant mask during PMOS source/drain formation, while a final composite insulator spacer is used an implant mask during NMOS source/drain formation.

SUMMARY OF THE INVENTION

It is an object of this invention to integrate the fabrication of CMOS devices, comprised of PMOS and NMOS devices, on the same semiconductor chip.

It is another object of this invention to use a composite insulator spacer to define an implanted source/drain region for the PMOS device, while using a partially etched, L-shaped composite insulator spacer to define an implanted source/drain region for the NMOS device.

It is still another object of this invention to remove a doped oxide component of an initial composite insulator spacer, comprised of an underlying silicon oxide shape, a silicon nitride shape, and the overlying doped oxide component, to form the L shaped composite insulator spacer used for definition of the NMOS source/drain region.

In accordance with the present invention a process for integrating the fabrication of NMOS and PMOS devices, featuring a composite insulator spacer used to define an implanted PMOS source/drain region, and featuring a partially etched, L-shaped composite insulator spacer used to define an implanted NMOS source/drain region, is described. After formation of insulator filled, shallow trench isolation (STI), regions, an N well region is formed in a portion of a P type semiconductor substrate to be used for PMOS devices, while the remaining portion of the P type semiconductor substrate, is reserved for accommodation of the subsequent NMOS devices. After formation of gate structures, on an underlying gate insulator layer, N type lightly doped source/drain (LDD), regions, or source/drain extension (SDE) regions, are formed in areas of the P type semiconductor substrate not covered by gate structures, while P type LDD or SDE regions are formed in areas of the N well region not covered by gate structures. A composite insulator layer, comprised of an underlying silicon oxide layer, a silicon nitride layer, and an overlying phosphosilicate glass (PSG), layer, is next deposited. Anisotropic reactive ion etching (RIE) procedures are then employed to define composite insulator spacers, each comprised of an underlying silicon oxide shape, a silicon nitride shape, and a PSG shape, on the sides of all gate structures. The composite insulator spacer is then used for definition of a heavily doped P type source/drain region, via implantation of P type ions in a area of the N well region not covered by a gate structure or by the composite insulator spacer. A photoresist shape protected NMOS regions from this implantation procedure. After removal of the photoresist shape the PSG components of the composite insulator spacers are removed resulting in L-shaped composite insulator spacers, each comprised of an underlying silicon oxide shape and an overlying silicon nitride shape. Another photoresist shape is next used to protect PMOS regions from another ion implantation procedure, used to form a deep, heavily doped N type source/drain region in an area of the P type semiconductor substrate not covered by the gate structure, or by the L-shaped composite insulator spacer, while the same implantation procedure allows a shallower, heavily doped N type source/drain region to be formed in an area of the P type semiconductor substrate not covered by the gate structure or by the vertical feature of the composite insulator spacer. An anneal procedure is next used to activate the implanted dopants, followed by formation of a self aligned metal silicide (salicide), layer, on the top surface of the gate structures as well as on the exposed portions of both heavily doped source/drain regions.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

Figure 1:
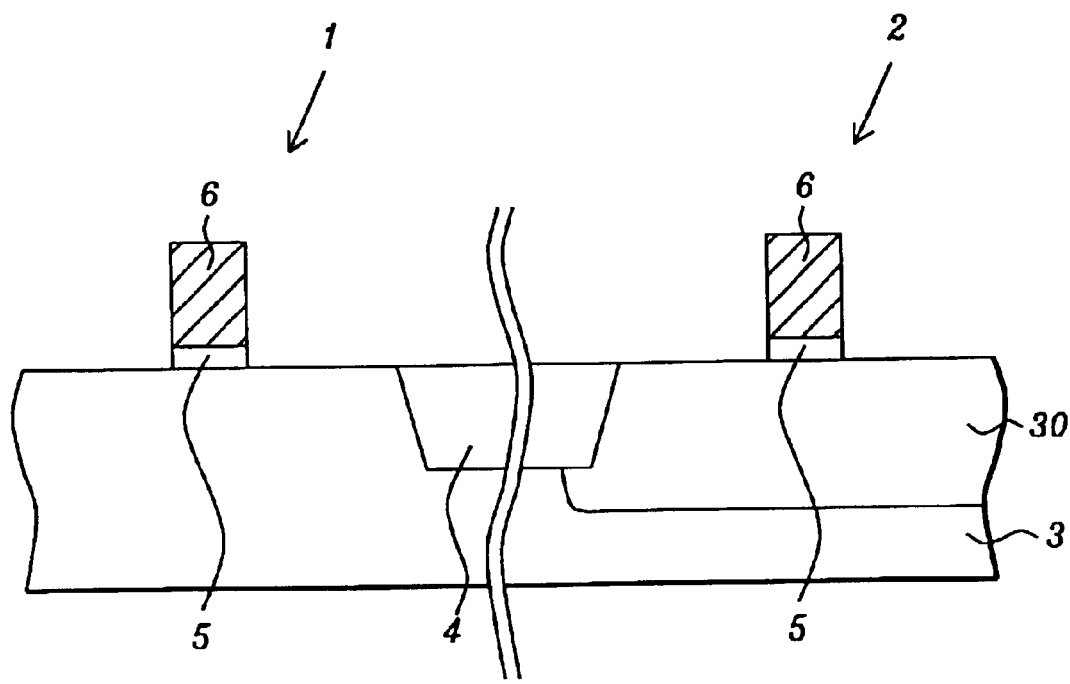
FIGS. 1–8, which schematically, in cross-sectional style, describe key stages of fabrication used to form CMOS devices, featuring a composite insulator spacer used to define an implanted PMOS source/drain region, and featuring a partially etched, L shape composite insulator spacer used to define an implanted NMOS source/drain region.

The method of forming a CMOS device featuring a composite insulator spacer used to define an implanted PMOS source/drain region, followed by formation of an implanted NMOS source/drain region, defined using a partially etched, L-shaped composite insulator spacer as a mask, will now be described in detail. Semiconductor substrate 3, comprised of P type, single crystalline silicon, featuring a <100> crystallographic orientation, is used and schematically shown in FIG. 1. Region 1, of semiconductor substrate 3, will be used for the CMOS, N channel, or the NMOS element of the CMOS device, while region 2, will be used to accommodate the P channel, or PMOS device. Insulator filled, shallow trench isolation (STI) region 4, is formed in a top portion of semiconductor substrate 3, via initially defining a shallow trench shape in a top portion of semiconductor substrate 3, via photolithographic and reactive ion etching (RIE) procedures. The shallow trench shape, at a depth between about 2000 to 5000 Angstroms in semiconductor substrate 3, is then filled with a silicon oxide layer, obtained via low pressure chemical vapor deposition (LPCVD), via plasma enhanced chemical vapor deposition (PECVD), procedures, or via high density plasma (HDP), procedures, using tetraethylorthosilicate (TEOS) as source. Portions of the silicon oxide layer residing on the top surface of semiconductor substrate 3, are selectively removed via chemical mechanical polishing (CMP) procedures, resulting in the definition of STI region 4. N well region 30, used to accommodate PMOS devices, is next formed in PMOS region 2, via implantation of arsenic or phosphorous ions, using a photoresist shape (not shown in the drawings), to protect NMOS region 1, from this implantation procedure. The result of these procedures is schematically shown in FIG. 1.

After removal of the photoresist shape used to block out NMOS region from the N well implantation procedure, a suitable dielectric layer such as silicon dioxide gate insulator layer 5, is thermally grown, in an oxygen—steam ambient, to a thickness between about 12 to 15 Angstroms. A polysilicon layer is next deposited via LPCVD procedures at a thickness between about 1200 to 2000 Angstroms. The polysilicon layer can be deposited intrinsically, then if specific threshold voltages are desired portions of the intrinsic polysilicon layer residing in NMOS region 1, can be doped N type, while portions of the intrinsic polysilicon layer residing in PMOS region 2, can be doped P type. These doping procedures would be performed via ion implantation procedures, using photoresist block shapes as implant masks. If desired subsequent gate structures for both NMOS and PMOS devices, can be comprised with a specific type dopant, thus allowing the polysilicon layer to be in situ doped during deposition, via the addition of arsine or phosphine, to a silane ambient. In addition if lower word line resistance is desired subsequent gate structures can be formed from a polycide (metal silicide-polysilicon), layer. This would require deposition of an underlying, thin polysilicon layer, followed by the deposition via LPCVD procedures, of an overlying metal silicide layer, such as a tungsten silicide layer. After deposition of the polysilicon or polycide layer, a photoresist shape (not shown in the drawings), is used as a mask to allow an anisotropic RIE procedure, using $Cl_2$ or $SF_6$ as an etchant to define gate structures 6, schematically shown in FIG. 1. Removal of the gate defining photoresist shape is accomplished via plasma oxygen ashing and careful wet cleans. The wet clean portion of the photoresist removal procedure, employs a buffered hydrofluoric (BHF), or a dilute hydrofluoric (DHF), step, which removes the portions of silicon dioxide gate insulator layer 5, not covered by gate structures 6.

Figure 2:
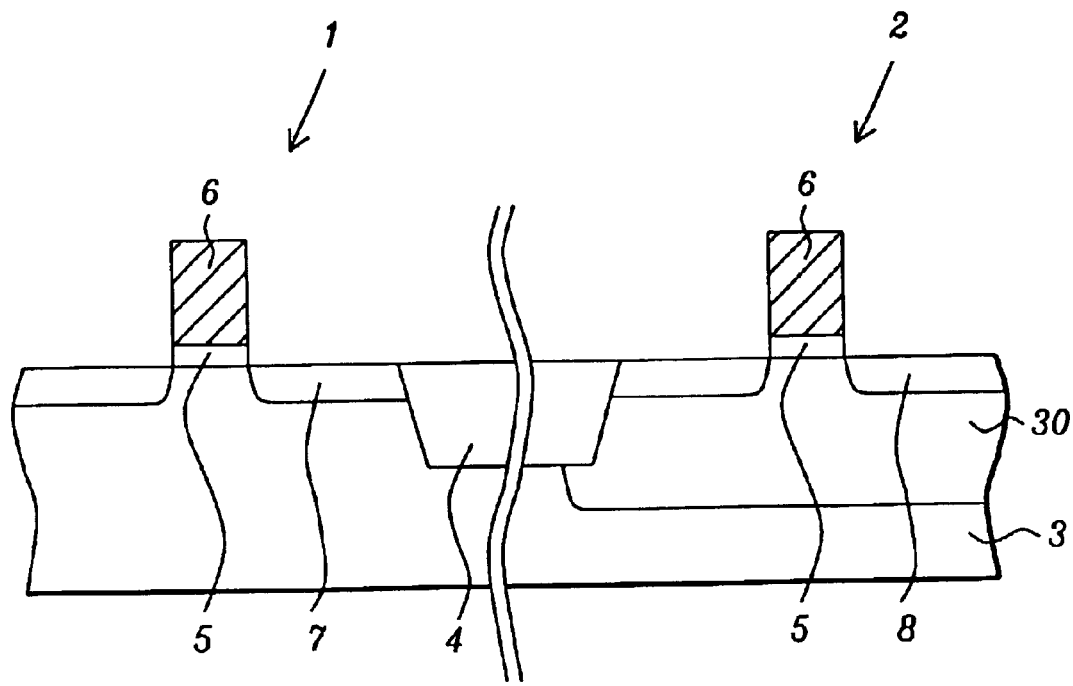

A photoresist shape (not shown in the drawings), is used to protect or block out PMOS region 2, from arsenic or phosphorous ions, implanted at an energy between about 1 to 5 KeV, at a dose between about 5E14 to 2E15 atoms/cm$^2$. This procedure results in the creation of N type lightly doped source/drain (LDD), or N type source/drain extension (SDE) region 7. After removal of the PMOS photoresist block out shape, via plasma oxygen ashing procedures, another photoresist shape (not shown in the drawings), is used to protect NMOS region 1, from implantation of boron ions implanted at an energy between about 0.4 to 1 KeV for boron, or from $BF_2$ ions implanted at an energy between about 5 to 20 KeV for $BF_2$, both implanted using a dose between about 1E14 to 1.5E15 atoms/cm$^2$, resulting in P type LDD, or P type SDE region 8. This is schematically shown in FIG. 2. Removal of the NMOS photoresist block out shape is again accomplished via plasma oxygen ashing procedures.

Figure 3:
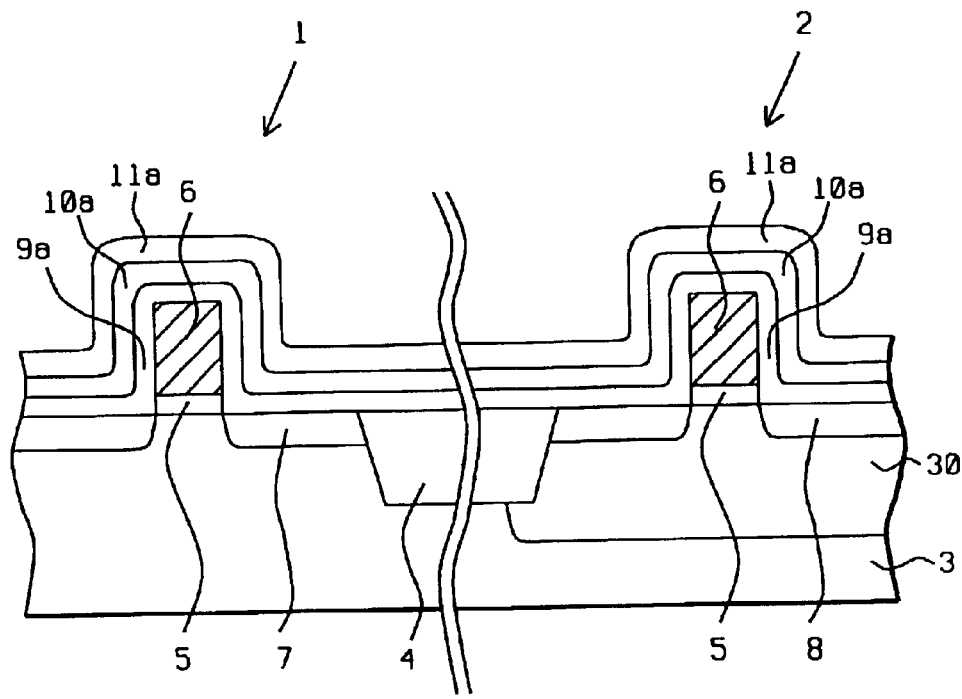

FIG. 3, shows the result of deposition of a composite insulator layer. Silicon oxide layer 9a, is first deposited via LPCVD or PECVD procedures, at a thickness between about 50 to 150 Angstroms, using TEOS as a source. This is followed by deposition of silicon nitride layer 10a, via LPCVD or PECVD procedures, at a thickness between about 150 to 350 Angstroms. Finally doped silicon oxide layer 11a, such as a phosphosilicate glass (PSG), layer, is deposited via PECVD procedures at a thickness between about 450 to 750 Angstroms. The composition of, or the content of phosphorous in PSG layer 11a, is between about 3 to 5 weight percent, and will determine the etch rate of the PSG layer in a subsequent BHF or DHF solution. The high etch rate ratio of PSG to silicon oxide, such as the silicon oxide residing in STI region 30, will allow the PSG component to be removed without significantly thinning the slower etching silicon oxide component. If desired prior to deposition of the composite insulator layer, an oxidation procedure can be employed resulting in a thin, protective silicon oxide layer formed on the sides of gate structures 6, as well as on the surface of the SDE regions.

Figure 4:
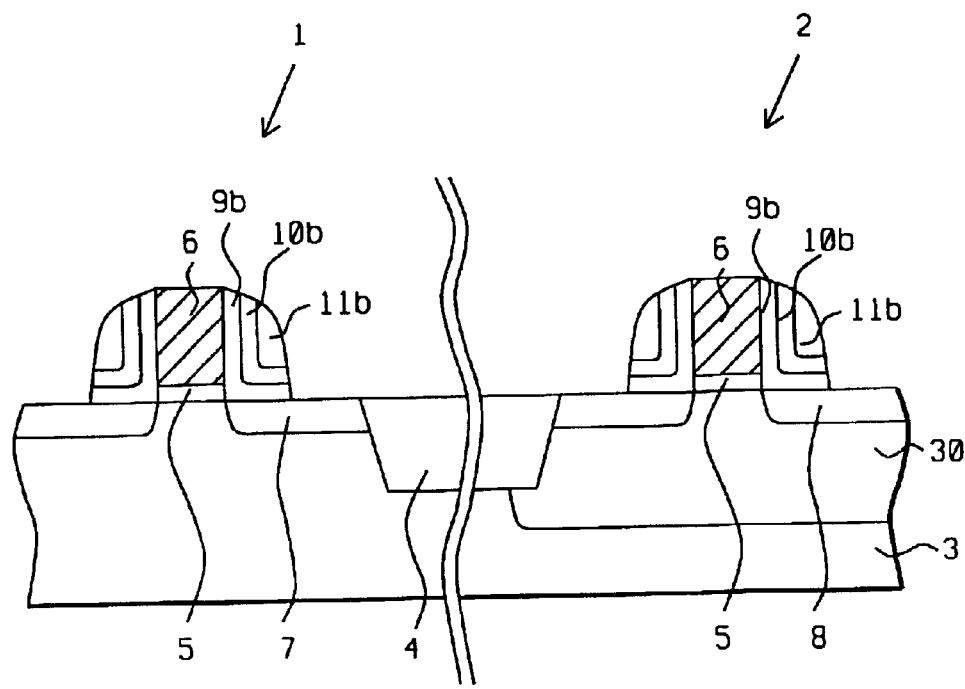

The definition of composite insulator spacers is next addressed and schematically illustrated in FIG. 4. An anisotropic RIE procedure is employed, first using $CHF_3$ as an etchant to define PSG shapes 11b. The anisotropic RIE procedure is continued using $Cl_2$ or $CF_4$ as an etchant for silicon nitride resulting in definition of silicon nitride shapes 10b. The silicon nitride dry etch procedure is terminated on underlying silicon oxide layer 9a, after removing between about 10 to 40 Angstroms of silicon oxide layer 9a, either completely, or partially defining silicon oxide shape 9b.

Figure 5:
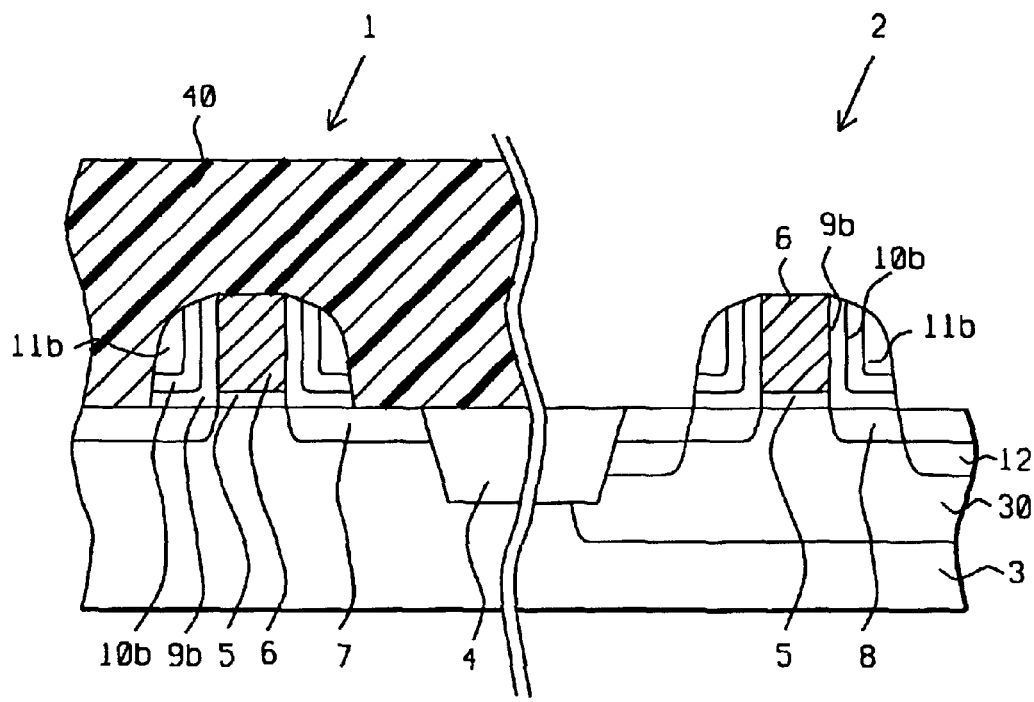

Photoresist shape 40, is next formed and used as a mask to protect NMOS region 1, from implantation of boron or $BF_2$ ions, into a portion of semiconductor substrate 1, in PMOS region 2, not covered by gate structure 6, or by the composite insulator spacer. The result of this implantation procedure, performed at an energy between about 3 to 6 Kev, at a dose between about 2E15 to 5E15 atoms/cm$^2$, is the formation of heavily doped P type source/drain region 12. The benefit of using the entire composite insulator spacer as a mask to define heavily doped P type source/drain region 12, is maintaining, or not compromising P type SDE region 8. If PSG shape 11b, were removed prior to this implantation procedure, boron ions may have penetrated the horizontal feature of silicon nitride shape 10b, converting a portion of the lightly doped P type source/drain region, to an undesired heavily doped region, or deepening the junction of the P type source/drain extension (SDE), region. Thus the presence of PSG shape 11b, during the heavily doped P type source/drain procedure allowed deep heavily doped P type source/drain regions to be formed without the risk of short channel effects which could occur if the heavily doped implantation procedure penetrated the horizontal feature of L-shaped silicon nitride shape 10b. The result of this procedure is schematically shown in FIG. 5.

Figure 6:
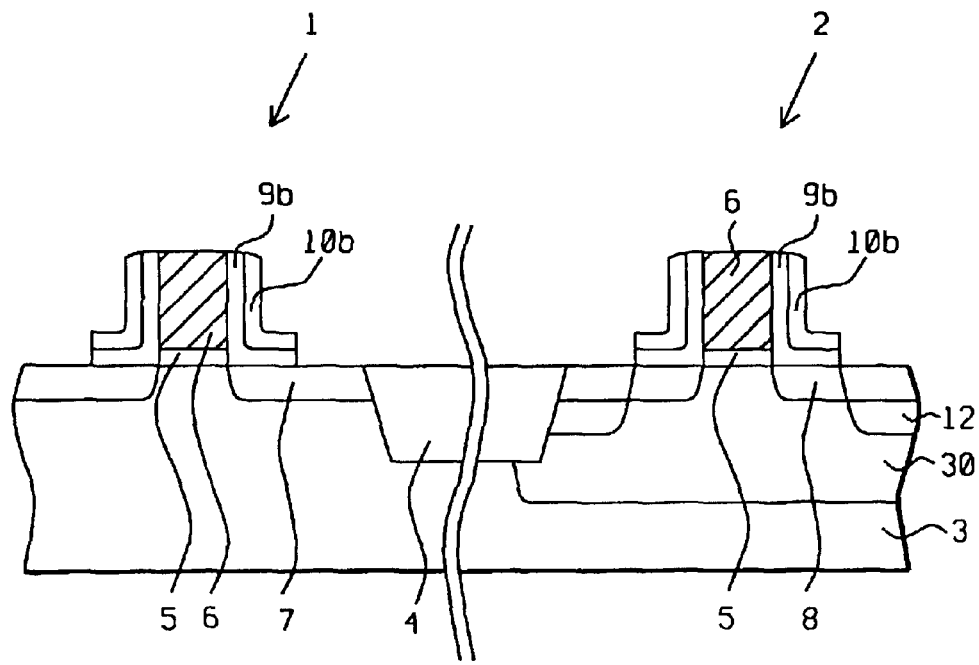

Removal of photoresist shape 40, is next accomplished via plasma oxygen ashing procedures, followed by removal of PSG shapes 11b, via use of a BHF or DHF acid solution. The high etch rate ratio of PSG to silicon oxide, between about 10 to 1, to 15 to 1, allows the PSG shapes to be removed without thinning the slower etching silicon oxide component in STI region 4. The removal of PSG resulted in remaining L-shaped composite insulator spacers, now comprised of the L-shaped, silicon nitride components 10b, and underlying L-shaped, silicon oxide components 9b. The wet etch procedure used to remove PSG shapes 11b, will also finalize the definition of silicon oxide shapes 9b, if the silicon oxide shapes had not been completely defined during the final stages of definition of silicon nitride shapes 10b. This is schematically shown in FIG. 6.

Figure 7:
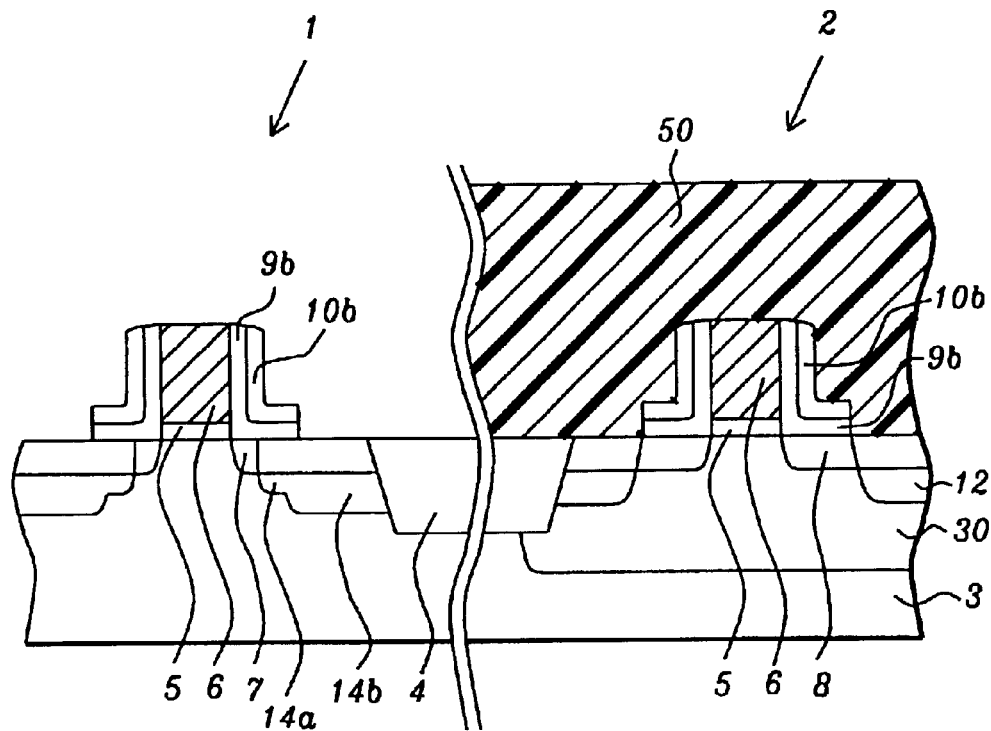

Photoresist shape 50, is next formed to protect PMOS region 2, from the procedure used to form a heavily doped N type source/drain region in NMOS region 1. This is achieved via implantation of arsenic ions, at an energy between about 35 to 65 KeV, at a dose between about 2E15 to 6E15 atoms/cm$^2$. Arsenic ions, implanted directly into portions of semiconductor substrate 1, not covered by gate structure 6, or by the L-shaped composite insulator spacers, result in the creation of deep, heavily doped N type source/drain region 14b, while arsenic ions implanted through the horizontal feature of L-shaped, silicon nitride components 10b, result in a shallower, heavily doped, N type source/drain region 14a. This is schematically shown in FIG. 7. The effect of shallower, heavily doped N type source/drain region 14a, is the increase in the doping level of N type SDE region 7, resulting in a lowering of SDE resistance, thus improving the performance of the NMOS device. After removal of photoresist shape 50, via plasma oxygen ashing, an anneal procedure is performed to activate the implanted ions of both heavily doped source/drain regions. It should be noted that although the arsenic ions are allowed to penetrate the spacer structure it does not pose as much of a danger to N channel transistor short channel performance as boron ions would to the P channel transistors, due to the lower diffusivity of arsenic, compared to boron, during the source/drain anneal procedure. Also the use of doped glass can ensure that all of the oxide on the nitride spacer is removed thus preventing NMOS channel length variations arising from non-uniform, partial removal of the oxide overlying the nitride spacer. The anneal procedure is performed at a temperature between about 1000 to 1090° C., using either rapid thermal anneal, or conventional furnace procedures.

Figure 8:
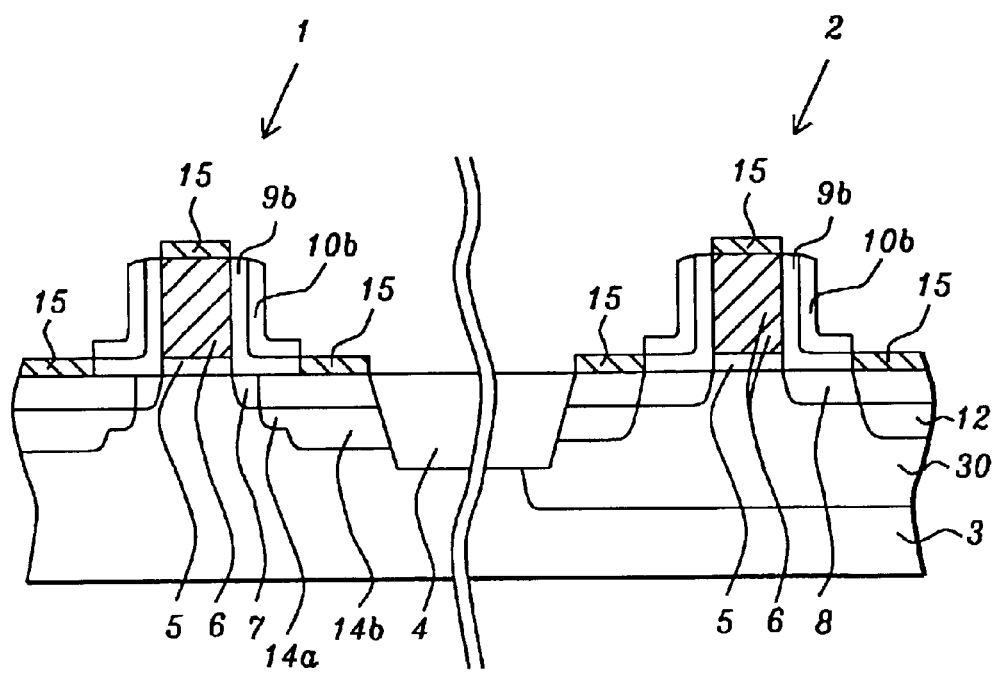

Metal silicide layers 15, are next formed on exposed silicon regions, such as on the exposed top surface of gate structures 6, as well as on the exposed surfaces of heavily doped N type source/drain region 14b, and of heavily doped P type source/drain region 12. This is accomplished via deposition of a metal layer such as titanium, nickel, or cobalt, via plasma vapor deposition procedures, followed by a rapid thermal anneal procedure, which allows formation of a metal silicide layer such as titanium silicide, nickel silicide, or cobalt silicide, to occur on regions in which the metal layer overlaid a silicon region. Regions in which the metal layer overlaid insulator regions, such as STI region 4, or L-shaped composite insulator spacers, remain unreacted. Selective removal of unreacted metal is then accomplished via wet etch procedures. The result of selective metal silicide formation is schematically shown in FIG. 8.

While this invention has been particularly shown and described with reference to, the preferred embodiments thereof, it will be understood by those skilled in the art that various changes in form and details may be made without departing from the spirit and scope of this invention.

What is claimed is:
1. A method of forming a complimentary metal oxide semiconductor (CMOS), device on a semiconductor substrate, comprising the steps of:
   providing a first gate structure on an underlying gate insulator layer, located in a first region of said semiconductor substrate to be used for an N channel metal oxide semiconductor (NMOS), element of said CMOS device, and providing a second gate structure on said underlying gate insulator layer, located in a second region of said semiconductor substrate to be used for a P channel metal oxide semiconductor (PMOS), element of said CMOS device;
   forming an N type, source/drain extension (SDE), region in a portion of said first region of said semiconductor substrate not covered by said first gate structure;
   forming a P type, source/drain extension (SDE), region in a portion of said second region of said semiconductor substrate not covered by said second gate structure;
   depositing a composite insulator layer comprised of an underlying silicon oxide layer, a silicon nitride layer, and an overlying doped oxide layer;
   performing an anisotropic dry etch procedure to form a first composite insulator spacer comprised of an overlying doped oxide component, an L-shaped silicon nitride component, and an underlying L-shaped silicon oxide component, on the sides of said first gate structure, and to form a second composite insulator shape comprised of an overlying doped oxide component, an L-shaped silicon nitride component, and an underlying L-shaped silicon oxide component, on the sides of said second gate structure;
   forming a heavily doped P type source/drain region in a portion of said second region of said semiconductor substrate not covered by said second gate structure, or by said second composite insulator spacer;
   removing said doped oxide components resulting in a first L-shaped composite insulator spacer located on the sides of said first gate structure, and resulting in a second L-shaped composite insulator spacer located on the sides of said second gate structure;
   forming a first heavily doped N type source/drain region in a portion of said first region of said semiconductor substrate not covered by said first gate structure or by said first L-shaped composite spacer, and forming a second heavily doped N type source/drain region in a portion of said first region of said semiconductor substrate, directly underlying horizontal feature of said L-shaped silicon nitride component of said first L-shaped composite insulator spacer; and
   forming metal silicide layers on the top surface of said first gate structure, on the top surface of said second gate structure, on the top surface of said first heavily doped N type source/drain region, and on the top surface of said heavily doped P type source/drain region.
2. The method of claim 1, wherein said gate insulator layer is a silicon dioxide layer, obtained via thermal oxidation procedures at a thickness between about 12 to 25 Angstroms.
3. The method of claim 1, wherein said gate structures are polysilicon gate structures, defined from a polysilicon layer which in turn is obtained via LPCVD procedures at thickness between about 1200 to 2000 Angstroms, either deposited intrinsically doped either N type, or P type, via ion implantation procedures, or in situ doped during deposition via the addition of arsine, or phosphine, to a silane ambient.

4. The method of claim 1, wherein said N type SDE region is formed via implantation of arsenic or phosphorous ions at an energy between about 1 to 5 KeV, at a dose between about 5E14 to 2E15 atoms/cm$^2$.

5. The method of claim 1, wherein said P type SDE region is formed via implantation of boron ions at an energy between about 0.4 to 1 KeV, at a dose between about 1E14 to 1.5E15 atoms/cm.

6. The method of claim 1, wherein said underlying silicon oxide layer of said composite insulator layer, is obtained via LPCVD or PECVD procedures, at a thickness between about 50 to 150 Angstroms.

7. The method of claim 1, wherein said silicon nitride layer of said composite insulator layer, is obtained via LPCVD or PECVD procedures, at a thickness between about 150 to 350 Angstroms.

8. The method of claim 1, wherein said doped oxide layer of said composite insulator layer, is a phosphosilicate glass (PSG) layer, obtained via PECVD procedures at a thickness between about 450 to 700 Angstroms, and comprised with a weight percent of phosphorous between about 3 to 5.

9. The method of claim 1, wherein said anisotropic dry etch procedure used to define the composite insulator spacers, is an anisotropic reactive ion etch (RIE), procedure, performed using CHF$_3$ as an etchant for said doped oxide layer and for said underlying silicon oxide layer, and using Cl$_2$ or CF$_4$ as an etchant for said silicon nitride layer.

10. The method of claim 1, wherein said heavily doped P type source/drain region is formed via implantation of boron ions at an energy between about 3 to 6 KeV, at a dose between about 2E15 to 5E15 atoms/cm$^2$.

11. The method of claim 1, wherein said doped oxide components of the composite insulator spacers, are removed using buffered hydrofluoric (BHF) acid, or a dilute hydrofluoric (DHF) acid, with an etch rate ratio of said doped oxide component to silicon oxide, between about 10 to 1, to 15 to 1.

12. The method of claim 1, wherein said first heavily doped N type source/drain region is formed via implantation of arsenic at an energy between about 35 to 65 KeV, at a dose between about 2E15 to 6E15 atoms/cm$^2$.

13. The method of claim 1, wherein said second heavily doped N type source/drain region is formed via identical implantation procedure used to form said first heavily doped N type source/drain region, via implantation of arsenic at an energy between about 35 to 65 KeV, at a dose between about 2E15 to 6E15 atoms/cm$^2$, however formed only in a portion of said first region of said semiconductor substrate located directly underlying said horizontal feature of said L-shaped, silicon nitride component.

14. The method of claim 1, wherein said metal silicide layer is comprised of either titanium silicide, nickel silicide, or cobalt silicide.

15. A method of forming a complimentary metal oxide semiconductor (CMOS), device on a semiconductor substrate, featuring a composite insulator spacer used as a mask to define an implanted P channel metal oxide semiconductor (PMOS), source/drain region, followed by the use of a partially etched, L shape composite insulator spacer as a mask to define an implanted N channel metal oxide semiconductor (NMOS), source/drain region, comprising the steps of:

providing a first region of said semiconductor substrate to be used as an NMOS region, and providing a second region of said semiconductor substrate to be used as a PMOS region;

forming a shallow trench isolation (STI), region, in a portion of said semiconductor located between said NMOS region and said PMOS region, with said STI region filled with a first silicon oxide layer;

forming an N well region in said PMOS region;

growing a silicon dioxide gate insulator layer on portions of said semiconductor substrate not occupied by said STI region;

forming a first polysilicon gate structure on a first portion of said underlying silicon dioxide gate insulator layer, located in said NMOS region, and forming a second polysilicon gate structure on a second portion of said underlying silicon dioxide gate insulator layer, located in said PMOS region;

performing a first ion implantation procedure to form an N type, source/drain extension (SDE), region in a portion of said NMOS region not covered by said first polysilicon gate structure;

performing a second ion implantation procedure to form a P type, source/drain extension (SDE), region in a portion of said PMOS region not covered by said second polysilicon gate structure;

depositing a composite insulator layer comprised of an underlying, second silicon oxide layer, a silicon nitride layer, and an overlying doped oxide layer;

performing an anisotropic reactive ion etching (RIE) procedure to form a first composite insulator spacer on the sides of said first polysilicon gate structure, with said first composite insulator spacer comprised of an overlying doped oxide component, an L-shaped silicon nitride component, and an underlying L-shaped silicon oxide component, and to form a second composite insulator shape on the sides of said second polysilicon gate structure, with said second composite insulator spacer comprised of an overlying doped oxide component, an L-shaped silicon nitride component, and an underlying L-shaped silicon oxide component;

performing a third ion implantation procedure to form a heavily doped P type source/drain region in a portion of said PMOS region not covered by said second polysilicon gate structure, or by said second composite insulator spacer;

performing a wet etch procedure to remove said doped oxide components, resulting in a first L-shaped composite insulator spacer located on the sides of said first polysilicon gate structure, and resulting in a second L-shaped composite insulator spacer located on the sides of said second polysilicon gate structure;

performing a fourth ion implantation procedure to form a first heavily doped N type source/drain region in a portion of said NMOS region not covered by said first polysilicon gate structure or by said first L-shaped composite spacer, and forming a second heavily doped N type source/drain region in a portion of said NMOS region, directly underlying horizontal feature of said L-shaped silicon nitride component of said first L-shaped composite insulator spacer, with said second heavily doped N type source/drain region located shallower in said semiconductor substrate than said first heavily doped N type source/drain region; and forming metal silicide layers on the top surface of said first polysilicon gate structure, on the top surface of said second polysilicon gate structure, on the top surface of said first heavily doped N type source/drain region, and on the top surface of said heavily doped P type source/drain region.

16. The method of claim 15, wherein said first silicon oxide layer, located in said STI region, is an undoped silicon oxide layer, obtained via LPCVD or PECVD procedures using tetraethylorthosilicate (TEOS), as a source.

17. The method of claim 15, wherein said silicon dioxide gate insulator layer is obtained via thermal oxidation procedures at a thickness between about 12 to 25 Angstroms.

18. The method of claim 15, wherein said first polysilicon gate structure and said second polysilicon gate structure, are defined from a polysilicon layer which in turn is obtained via LPCVD procedures, at thickness between about 1200 to 2000 Angstroms, either deposited intrinsically doped either N type, or P type, via ion implantation procedures, or doped in situ during deposition via the addition of arsine, or phosphine, to a silane ambient.

19. The method of claim 15, wherein said first ion implantation procedure, used to form said N type SDE region, is performed using arsenic or phosphorous ions at an energy between about 1 to 5 KeV, at a dose between about 5E14 to 2E15 atoms/cm$^2$.

20. The method of claim 15, wherein said second ion implantation procedure, used to form said P type SDE region, is performed using boron ions at an energy between about 0.4 to 1 KeV, at a dose between about 1E14 to 1.5E15 atoms/cm$^2$.

21. The method of claim 15, wherein said underlying, second silicon oxide layer is obtained via LPCVD or PECVD procedures, at a thickness between about 50 to 150 Angstroms.

22. The method of claim 15, wherein said silicon nitride layer is obtained via LPCVD or PECVD procedures, at a thickness between about 150 to 350 Angstroms.

23. The method of claim 15, wherein said doped oxide layer is a phosphosilicate glass (PSG) layer, obtained via PECVD procedures at a thickness between about 450 to 700 Angstroms, and comprised with a weight percent of phosphorous between about 3 to 5.

24. The method of claim 15, wherein said anisotropic RIE procedure used to define said first composite insulator spacer and said second composite insulator spacer, is performed using $CHF_3$ as an etchant for said doped oxide layer and for said underlying, second silicon oxide layer, while using $Cl_2$ or $CF_4$ as an etchant for said silicon nitride layer.

25. The method of claim 15, wherein said third ion implantation procedure, used to form said heavily doped P type source/drain region, is performed using boron ions at an energy between about 3 to 6 KeV, at a dose between about 2E15 to 5E15 atoms/cm$^2$.

26. The method of claim 15, wherein said wet etch procedure, used to remove said doped oxide components of the composite insulator spacers, is performed using a buffered hydrofluoric (BHF) acid, or a dilute hydrofluoric (DHF) acid solution, with an etch rate ratio of said doped oxide component to said first silicon oxide layer, located in said STI region, between about 10 to 1, to 15 to 1.

27. The method of claim 15, wherein said fourth ion implantation procedure, used to form said first heavily doped N type source/drain region, and to form said second heavily doped N type source/drain region, is performed using arsenic ions at an energy between about 35 to 65 KeV, at a dose between about 2E15 to 6E15 atoms/cm$^2$.

28. The method of claim 15, wherein said metal silicide layer is comprised of either titanium suicide, nickel silicide, or cobalt silicide.

* * * * *